United States Patent [19]
Ishikawa et al.

[11] Patent Number: 5,604,469
[45] Date of Patent: Feb. 18, 1997

[54] HIGH-FREQUENCY INTEGRATED CIRCUIT

[75] Inventors: Youhei Ishikawa; Toru Tanizaki, both of Kyoto; Hiroshi Nishida, Kawanishi, all of Japan

[73] Assignee: Murata Manufacturing Co., Ltd., Japan

[21] Appl. No.: 519,949

[22] Filed: Aug. 28, 1995

[30] Foreign Application Priority Data

Aug. 30, 1994 [JP] Japan .................................. 6-205427

[51] Int. Cl.$^6$ .................... H01P 1/383; H01P 3/16; H03B 5/18
[52] U.S. Cl. .................... 333/1.1; 331/96; 333/248; 333/254; 343/786
[58] Field of Search ...................... 333/239, 248, 333/254–257, 1.1; 331/96, 107 DP; 343/772, 785, 786

[56] References Cited

U.S. PATENT DOCUMENTS 4,463,330  7/1984  Yoneyama ................. 333/239
4,689,584  8/1987  Sequeira ................. 333/239 X
5,473,296  12/1995  Ishikawa et al. ................. 333/239

*Primary Examiner*—Paul Gensler
*Attorney, Agent, or Firm*—Ostrolenk, Faber, Gerb & Soffen, LLP

[57] ABSTRACT

A high-frequency integrated circuit which operates in a microwave band or in a millimeter wave band. The high-frequency integrated circuit has devices with a nonradiative dielectric waveguide such as an oscillator, a circulator, etc., and a mount case with a nonradiative dielectric waveguide in which these devices are mounted. Each of the devices with a nonradiative dielectric waveguide has a couple of conductors, a dielectric strip which is disposed between the conductors and propagates a high-frequency electromagnetic wave in a specified mode, a mounting surface which is formed on one of the conductors, and an end surface which is formed on an end of the conductors so as to be vertical to a traveling direction of the electromagnetic wave propagated in the dielectric strip and on which an end of the dielectric strip is exposed. The devices with a nonradiative dielectric waveguide are evaluated separately, and thereafter, the devices are mounted in the mount case individually.

9 Claims, 15 Drawing Sheets

F I G. 3B
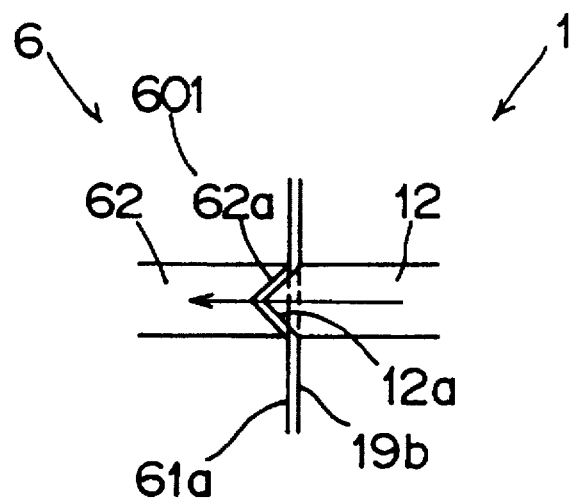
F I G. 3C
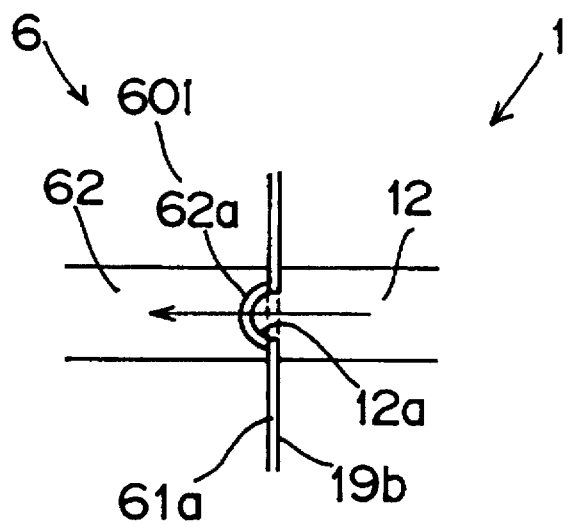

F I G. 5A
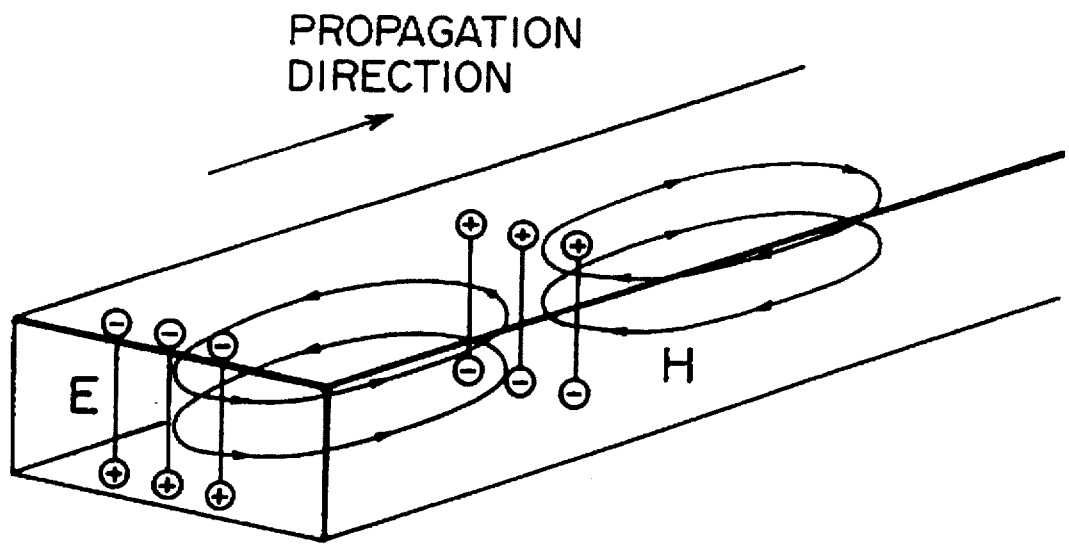
F I G. 5B
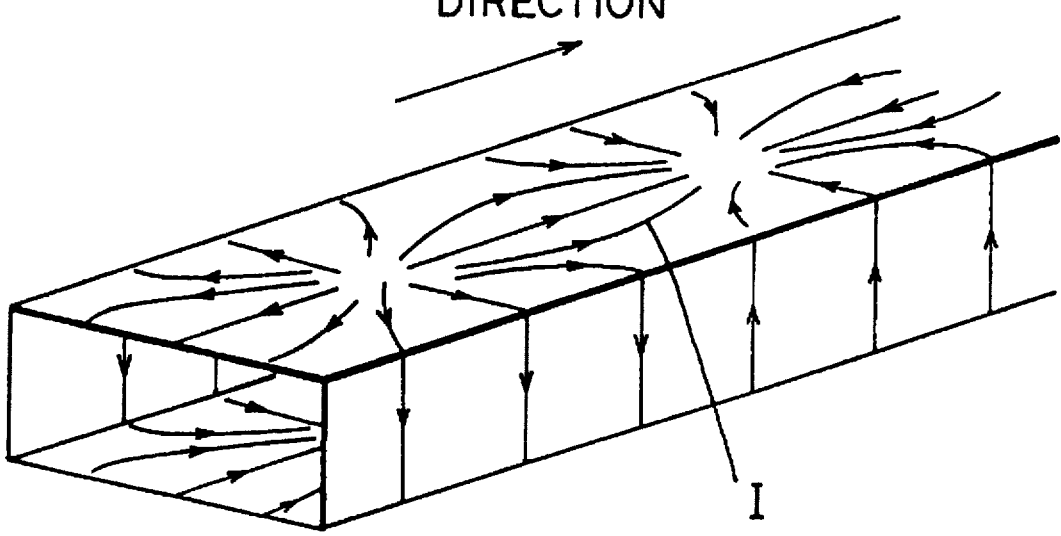

F I G. 11A
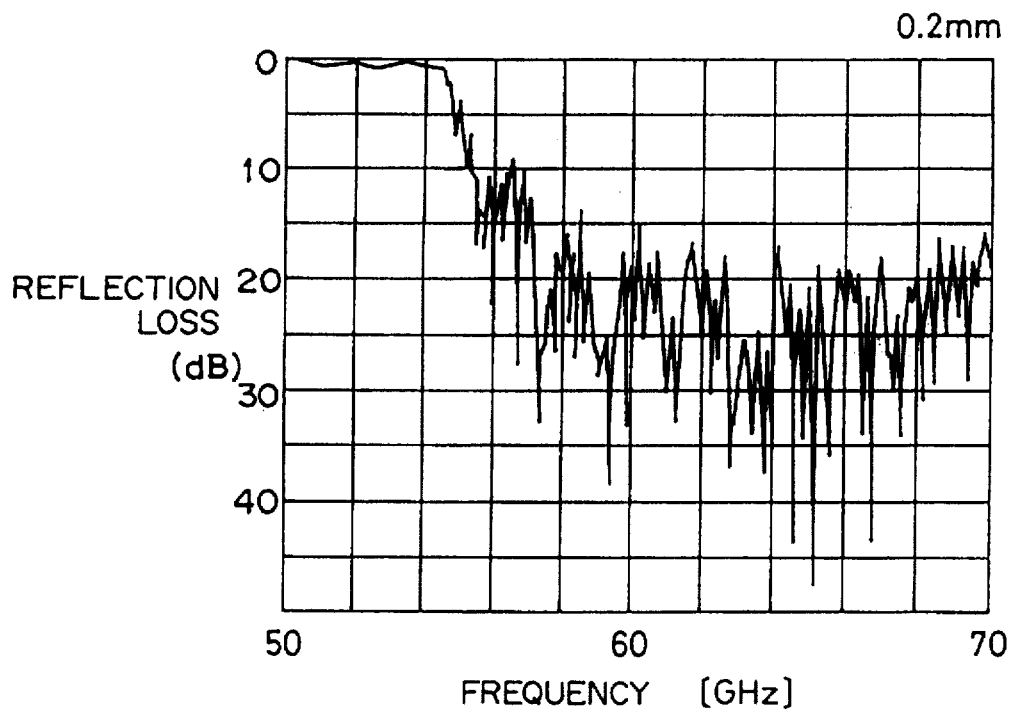
F I G. 11B
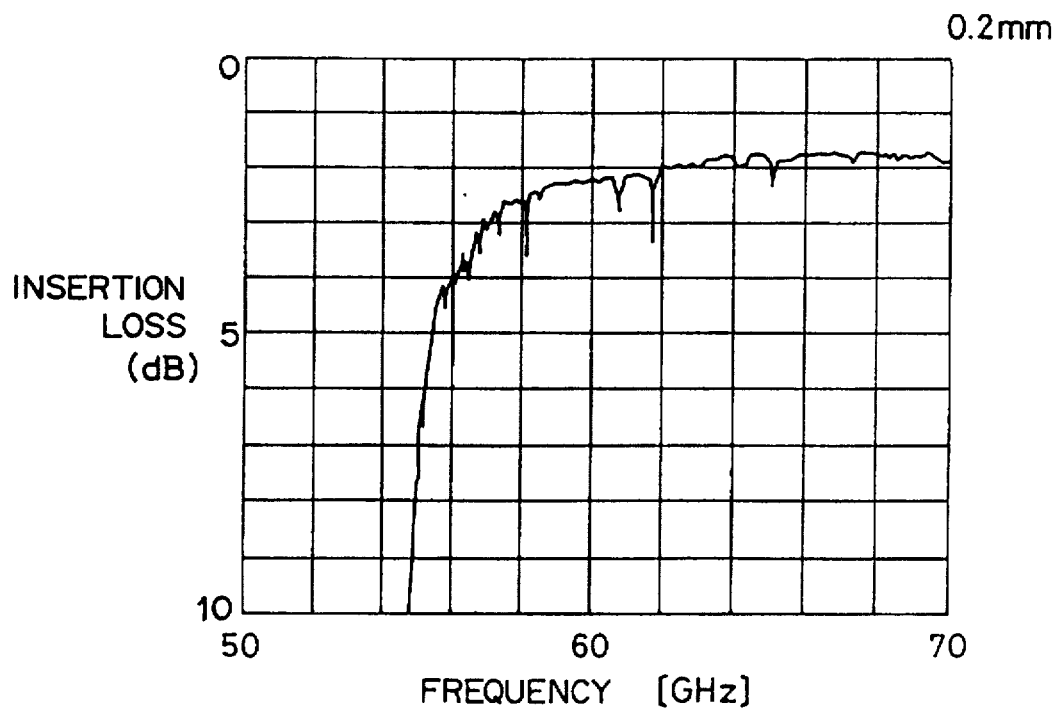

5,604,469

HIGH-FREQUENCY INTEGRATED CIRCUIT

BACKGROUND OF THE INVENTION

1. Field of the Invention

The present invention relates to a high-frequency integrated circuit, and more particularly to a high-frequency integrated circuit which has a nonradiative dielectric waveguide and operates in a microwave band or in a millimeter wave band.

2. Description of Related Art

It is well known that dielectric strips can be arranged between a pair of conductive plates which are parallel to each other with a specified spacing to form a nonradiative dielectric waveguide which propagates an electromagnetic wave in the LSM01 mode or LSE01 mode. For example, if the dielectric strips are designed to be made of a dielectric material with a dielectric constant ($\epsilon r$) of 2 such as fluororesin and to have a width b of 2.5 mm and a height a of 2.25 mm, the dielectric strips will form a nonradiative dielectric waveguide which propagates an electromagnetic wave in a band of 60 GHz. When these dielectric strips are put between two conductive plates, an electromagnetic wave which has a wavelength more than twice the height a hardly leaks from the dielectric strips. Therefore, an electromagnetic wave in LSM01 mode or in LSE01 mode is propagated along the dielectric strips without radiating, that is, with a small loss. Thus, such a nonradiative dielectric waveguide is suited to be used as a transmission line for a microwave band or a millimeter wave band.

Since it is possible to provide magnetic parts and semiconductor chips as well as dielectric strips between a couple of conductive plates, a circulator, an oscillator and the like which have a nonradiative dielectric waveguide can be formed. In this way, a high-frequency integrated circuit which operates in a microwave band or in a millimeter wave band can be produced.

In producing such a high-frequency integrated circuit, first, evaluation is conventionally carried out. For example, in producing an FM-CW radar, dielectric strips, magnetic parts and semiconductor chips are arranged between a pair of conductive plates for evaluation to form a circulator, an oscillator and so on. The conductive plates are connected to an evaluation terminal, and the characteristics of the whole circuit which is composed of the circulator, the oscillator, etc. are measured. Then, the dielectric strips, the magnetic parts and the semiconductor chips are dismounted from the conductive evaluation plates, and then these parts are rearranged between another pair of conductive plates to produce an integrated circuit.

However, in this method, it is difficult to rearrange the circulator, the oscillator, etc. in the same way to reproduce an integrated circuit with the characteristics as measured. In this method, it is impossible to evaluate and adjust the circulator, the oscillator, etc. individually. Therefore, the mass productivity of the integrated circuit is not good. Further, when the integrated circuit has a defect, and a part of the integrated circuit, for example, the circulator or the oscillator is exchanged, the change of the part may influence the whole circuit.

SUMMARY OF THE INVENTION

An object of the present invention is to provide a high-frequency integrated circuit and components thereof which are suited for mass production.

In order to attain the object, a high-frequency integrated circuit according to the present invention has a device with a nonradiative dielectric waveguide and a mount case with a nonradiative dielectric waveguide. The device with a nonradiative dielectric waveguide comprises: a couple of first conductors which are parallel to each other with a specified spacing; a first dielectric strip which is disposed between the first conductors; a plane mounting surface which is formed on one of the first conductors; and an end surface which is formed on an end of the first conductors so as to be vertical to a direction in which an electromagnetic wave is propagated in the first dielectric strip, an end of the first dielectric strip being exposed on the end surface. The mount case with a nonradiative dielectric waveguide comprises: a couple of second conductors which are parallel to each other with a specified spacing, the device with a nonradiative dielectric waveguide being placed between the second conductors; and a second dielectric strip which is disposed between the second conductors.

The device with a nonradiative dielectric waveguide and the mount case with a nonradiative dielectric waveguide are produced separately. The device is evaluated, and thereafter, the device is mounted in the mount case. If necessary, the device can be dismounted from the mount case easily.

BRIEF DESCRIPTION OF THE DRAWINGS

This and other objects and features of the present invention will be apparent from the following description with reference to the accompanying drawings, in which:

FIG. 3B is an internal plan view of a modification of the connecting portion between the dielectric strip of the oscillator and the dielectric strip of the measuring jig;

FIG. 3C is an internal plan view of another modification of the connecting portion between the dielectric strip of the oscillator and the dielectric strip of the measuring jig;

FIG. 5A is a distribution chart which shows an electric field and a magnetic field of an electromagnetic wave which is propagated in a metal tubular waveguide in TE10 mode;

FIG. 5B is a distribution chart which shows a surface current of the electromagnetic wave which is propagated in the metal tubular waveguide in TE10 mode;

FIG. 11A is a graph which shows a reflection loss characteristic of the oscillator when only the conductive plates have a gap of 0.2 mm;

FIG. 11B is a graph which shows an insertion loss characteristic of the oscillator when only the conductive plates have a gap of 0.2 mm;

DETAILED DESCRIPTION OF THE PREFERRED EMBODIMENTS

A high-frequency integrated circuit which is an embodiment of the present invention is described with reference to the accompanying drawings.

The high-frequency integrated circuit is used, for example, as a high frequency section of an FM-CW radar which operates in a millimeter wave band. Further, by providing an antenna 8 to the high frequency section, the high frequency section is used as a radar head. The high-frequency integrated circuit comprises devices with a nonradiative dielectric waveguide, namely, an oscillator 1, a circulator 2, etc., and a mount case 7 with a nonradiative dielectric waveguide in which these devices are mounted.

Figure 1:
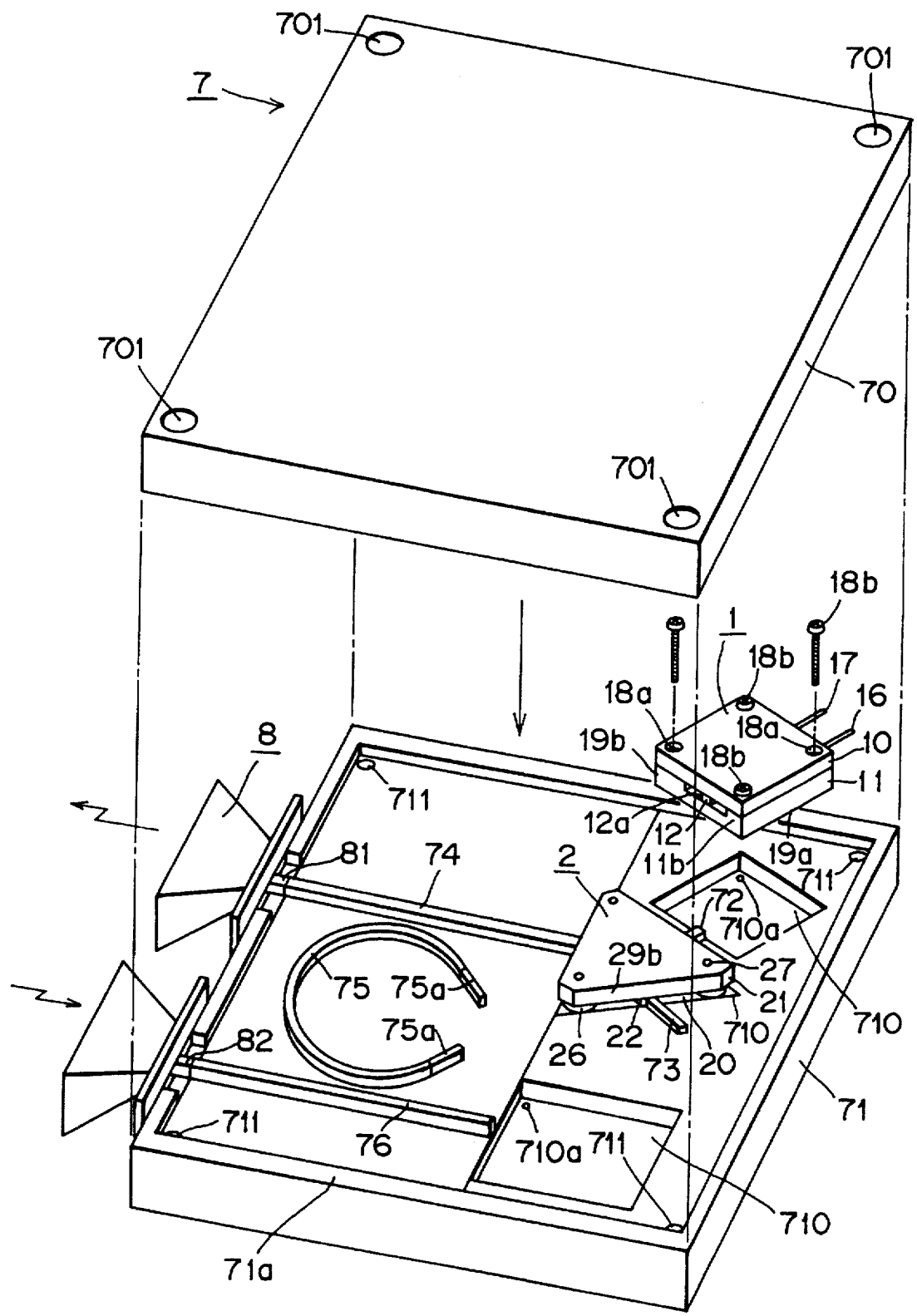
FIG. 1 is an exploded perspective view of a high-frequency integrated circuit which is an embodiment of the present invention.

As shown in FIG. 1, the oscillator 1 comprises a couple of rectangular conductive plates 10 and 11, a dielectric strip 12 and semiconductor chips (not shown) which are disposed between the conductive plates 10 and 11, a power terminal 16 and a modulating terminal 17. The conductive plates 10 and 11 are made of a conductive material such as aluminum, copper and the like. The conductive plate 11 has spacers 11b for keeping the space from the conductive plate 10 at a specified height a. The dielectric strip 12, as an example, is made of a dielectric material with a dielectric constant ($\epsilon r$) of 2 such as fluororesin, and is designed to have a height a of 2.25 mm and a width b of 2.5 mm. The conductive plates 10 and 11 have tapped holes 18a at the respective four corners. By tightening screws 18b into the tapped holes 18a, the dielectric strip 12 and the semiconductor chips are fixed between the conductive plates 10 and 11.

The conductive plate 11 has a plane mounting surface 19a on the lower side. The laminated conductive plates 10 and 11 have an end surface 19b on which an end 12a of the dielectric strip 12 shows, and the end surface 19b is vertical to a direction in which a high-frequency electromagnetic wave travels. The oscillator 1 outputs an electromagnetic wave to the circulator 2 through the end 12a of the dielectric strip 12.

The circulator 2 comprises a couple of triangular conductive plates 20 and 21, and three dielectric strips 22 (although only one dielectric strip is seen in FIG. 1) and magnetic parts (not shown) which are disposed between the conductive plates 20 and 21. The conductive plates are made of a conductive material such as aluminum, copper and the like. Between the conductive plates 20 and 21, spacers 26 for keeping the space therebetween at the height a are provided at the three corners. Tapped holes (not shown) are made in the conductive plates 20 and 21 at the respective three corners such that the tapped holes communicate with the spacers 26. By tightening screws 27 into the tapped holes, the dielectric strips 22 and the magnetic parts are fixed between the conductive plates 20 and 21.

Figure 12:
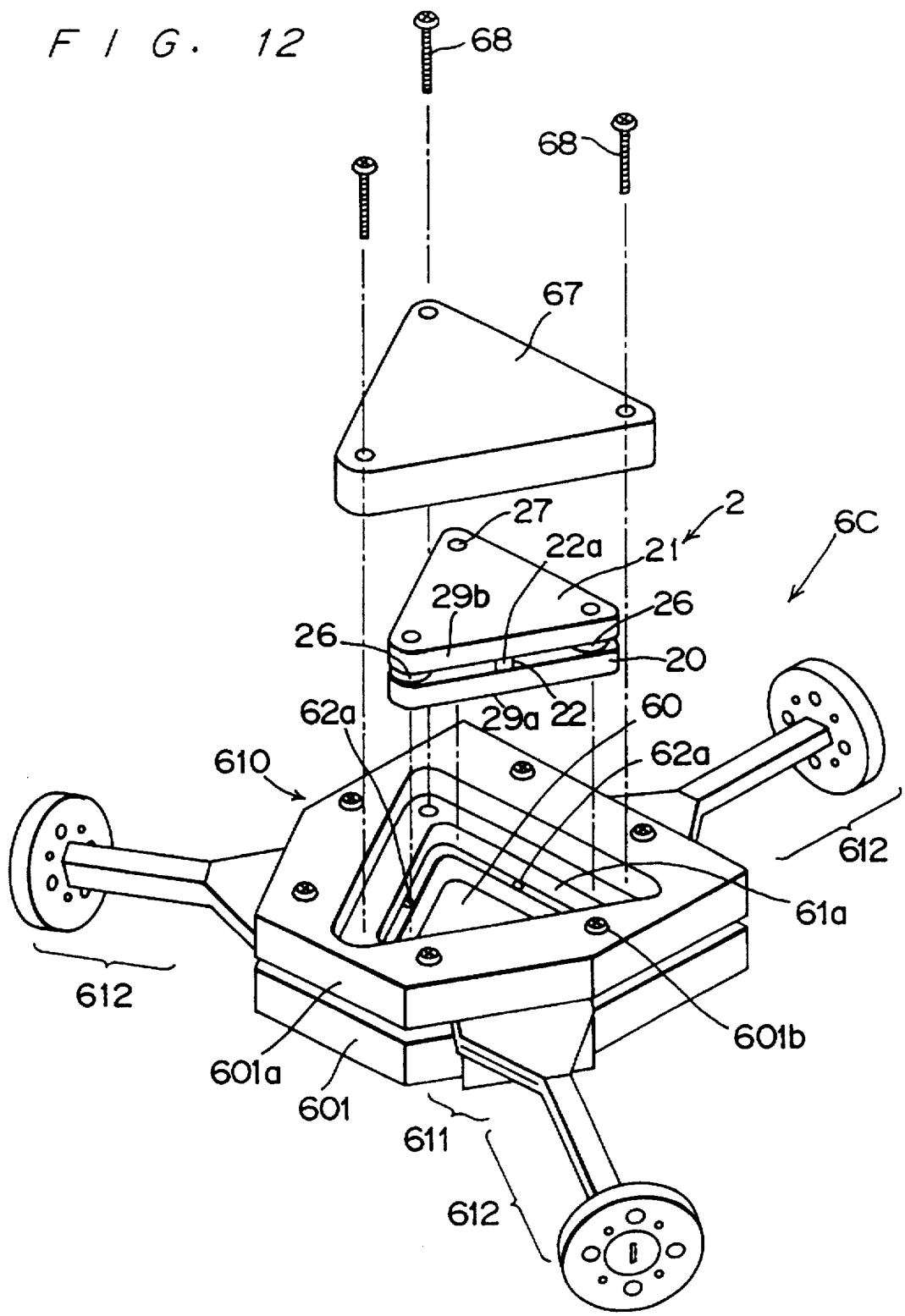
FIG. 12 is a perspective view of a measuring jig for evaluating a circulator of the integrated circuit of FIG. 1.

The conductive plate 20 has a plane mounting surface 29a on the lower side (see FIG. 12). On the three end surfaces 29b of the laminated conductive plates 20 and 21, respective ends 22a of the dielectric strips 22 show (see FIG. 12), and the end surfaces 29b are vertical to directions in which a high-frequency electromagnetic wave which is inputted or outputted through the ends 22a of the dielectric strips 22 travels.

The mount case 7 comprises a rectangular upper conductive plate 70, a rectangular lower conductive plate 71, and dielectric strips 72, 73, 74, 75 and 76 disposed between the conductive plates 70 and 71. The dielectric strips 72, 73, 74, 75 and 76, and nonreflective terminals 75a are glued to the lower conductive plate 71. The lower conductive plate 71 has spacers 71a on the four peripheral sides so as to make a specified space from the upper conductive plate 70. Tapped holes 701 and 711 are made in the conductive plates 70 and 71 at the respective four corners such that the conductive plates 70 and 71 can be fixed to each other. The dielectric strip 73 serves as a nonreflective terminal. The nonreflective terminals 75a are provided at both ends of the dielectric strip 75. The lower conductive plate 71 has recesses 710 which are of the respective configurations of the oscillator 1, the circulator 2 and a mixer (not shown). Likewise, the upper conductive plate 70 has recesses (not shown) of the same configurations.

The conductive plates 70 and 71 are plates of a conductive material or plates of an insulating material with a metallized surface. Tapped holes 710a are made in each of the recesses 710, and the oscillator 1, the circulator 2 and the mixer are fixed in the respective recesses 710 by the screws 18b and 27. Also, it is possible to nip the oscillator 1, the circulator 2 and the mixer between the conductive plates 70 and 71 or to fix these devices in the recesses 710 by solder or conductive paste.

One end of the dielectric strip 72 is in contact with the end 12a of the dielectric strip 12 of the oscillator 1, and the other end of the dielectric strip 72 is in contact with the end 22a of one of the dielectric strips 22 of the circulator 2. One end of the dielectric strip 73 is in contact with the end 22a of another of the dielectric strips 22 of the circulator 2. One end of the dielectric strip 74 is in contact with the end 22a of the other dielectric strip 22 of the circulator 2, and the other end of the dielectric strip 74 is in contact with an end of a transmitting rod 81 of the antenna 8. One end of the dielectric strip 76 is in contact with an end of a dielectric strip of the mixer, and the other end of the dielectric strip 76 is in contact with an end of a receiving rod 82 of the antenna 8.

The conductive plates 70 and 71, the dielectric strips 74, 75 and 76, and the nonreflective terminals 75a form a coupler.

Figure 2A:
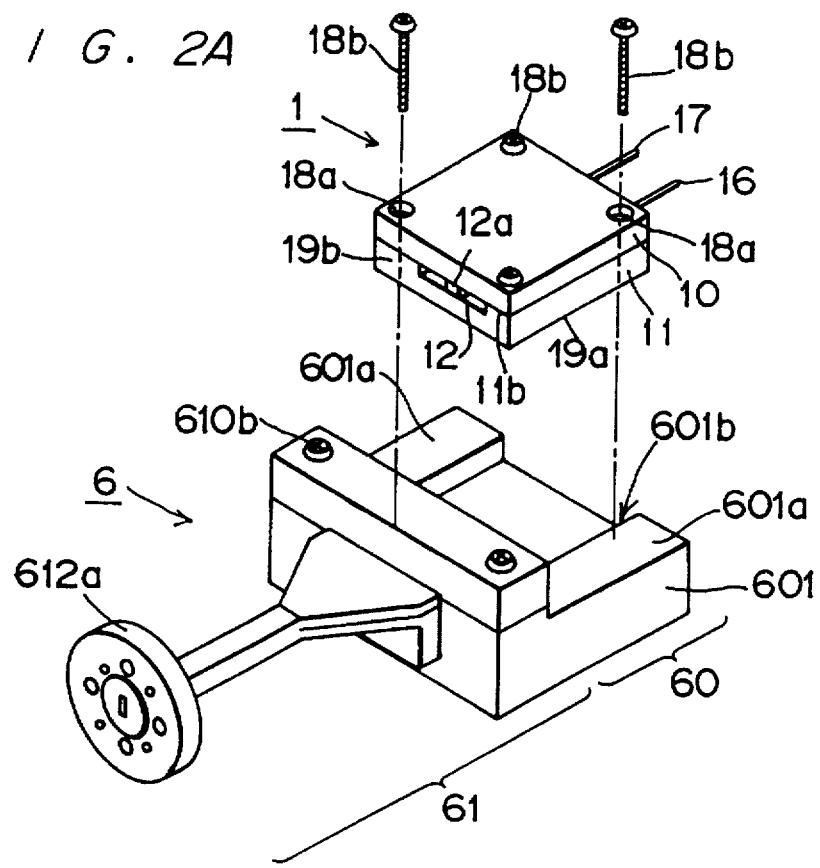
FIG. 2A is a perspective view of a measuring jig for evaluating an oscillator of the integrated circuit.
Figure 2B:
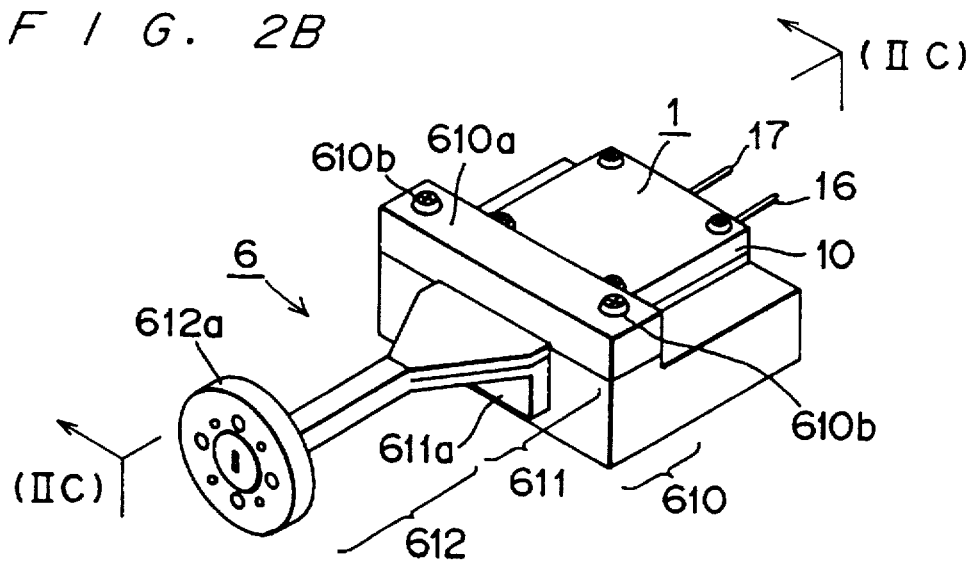
FIG. 2B is a perspective view of the measuring jig for and the oscillator mounted therein.
Figure 2C:
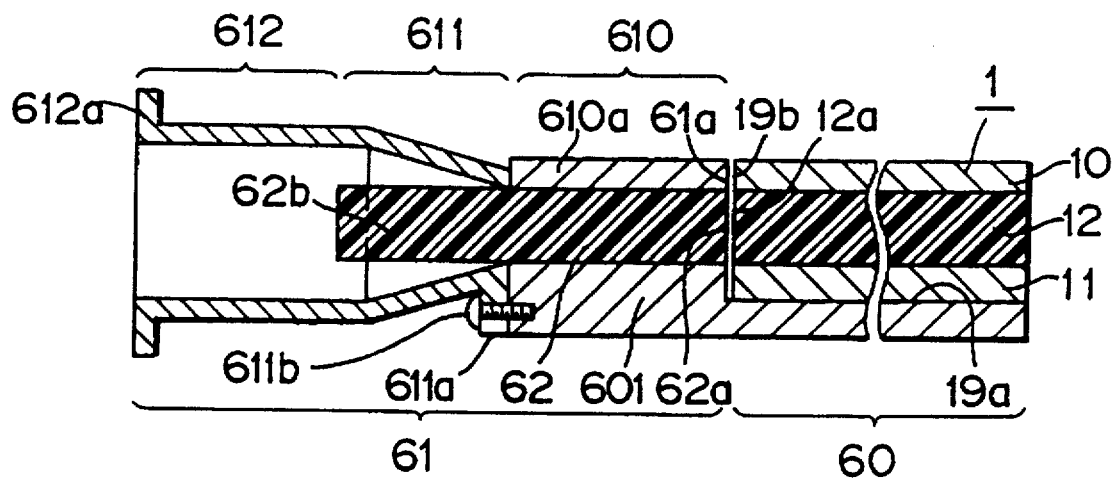
FIG. 2C is a sectional view of the measuring jig and the oscillator, taken along a line IIC—IIC in FIG. 2B.

FIGS. 2A, 2B and 2C show a jig 6 for measuring the characteristics of the oscillator 1. The jig 6 comprises a mount section 60 and a converting section 61. The mount section 60 is formed in a part of a base plate 601 which is made of a conductive material such as aluminum, copper and the like. The base plate 601 has a couple of side walls 601a for positioning the oscillator 1. The base plate 601 further has tapped holes 601b, and when the oscillator 1 is mounted in the mount section 60 with the mounting surface 19a on the base plate 601, the tapped holes 18a of the oscillator 1 communicate with the tapped holes 601b of the base plate 601. Therefore, the oscillator 1 can be fixed on the base plate 601 by the screws 18b.

The converting section 61 is to connect the oscillator 1 to a transmission line, for example, a metal tubular waveguide. The converting section 61 comprises a pressing section 610, a dielectric strip 62, a horn 611 and a metal tubular waveguide 612. In the pressing section 610, the dielectric waveguide 62 is partly fixed between the base plate 601 and a pressing plate 610a by screws 610b. The horn 611 is fixed to the pressing section 610 by joining a flange 611a thereof to the pressing section 610 by a screw 611b. The waveguide 612 has a flange 612a on its end.

On the side of the converting section 61 which faces the oscillator 1, an end surface 61a on which an end 62a of the dielectric strip 62 shows is formed, and the end surface 61a is vertical to a direction in which an electromagnetic wave is propagated in the dielectric strip 62. The other end 62b of the dielectric strip 62 is tapered in the width way such that the characteristic impedance of the dielectric strip 62 will match the characteristic impedance of the transmission line to which the metal tubular waveguide 612 is connected.

Figure 3A:
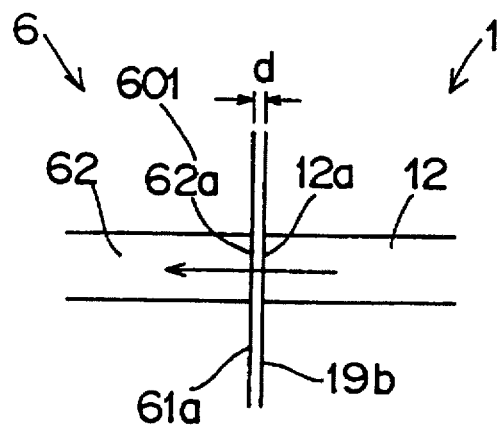
FIG. 3A is an internal plan view of a connecting portion between a dielectric strip of the oscillator and a dielectric strip of the measuring jig.

FIG. 3A is a plan view of a connecting portion between the dielectric strip 12 of the oscillator 1 and the dielectric strip 62 of the measuring jig 6, that is, the exposed end 12a of the dielectric strip 12 and the exposed end 62a of the dielectric strip 62. The ends 12a and 62a of the dielectric strips 12 and 62 are vertical to a direction in which an electromagnetic wave is propagated and are on a level with the end surface 19b of the oscillator 1 and the end surface 61a of the pressing section 610, respectively. The ends 12a and 62a are in contact with each other. The connection between the dielectric strips 12 and 62 is possible in other ways as illustrated in FIGS. 3B and 3C.

In FIG. 3B, the ends 12a and 62a of the dielectric strips 12 and 62 are wedges which engage with each other. The end 12a is slightly protruded from the end surface 19b of the oscillator 1 and the end 62a is slightly retracted. In FIG. 3C, the ends 12a and 62a of the dielectric strips 12 and 62 are round which engage with each other, and the end 12a is slightly protruded from the end surface 19b of the oscillator 1 and the end 62a is slightly retracted. As in the cases of FIGS. 3B and 3C, the ends 12a and 62a of the dielectric strips 12 and 62 do not have to be vertical to the electromagnetic wave propagation direction as long as the ends 12a and 62a engage with each other. It is also possible that the ends 12a and 62a which are vertical to the electromagnetic wave propagation direction are slightly protruded from the respective end surfaces 19b and 61a and are put into contact with each other.

Next, the action of the oscillator 1 is described. When a direct current is supplied to the power terminal 16 of the oscillator 1, a high-frequency electromagnetic wave is generated and inputted into the dielectric strip 12. Suppose that the space between the conductive plates 10 and 11 is a and the generated electromagnetic wave has a wavelength of $\lambda$. If $a<\lambda/2$, the electromagnetic wave which is propagated in a parallel direction to the conductive plates 10 and 11 does not leak from the dielectric strip 12. The electromagnetic wave is propagated in the dielectric strip 12 and is outputted through the end 12a. When the oscillator 1 is mounted in the measuring jig 6, the oscillator 1 acts in the same way, and the electromagnetic wave is outputted through the end 12a in the pressing section 610. Possible transmission modes of an electromagnetic wave in a nonradiative dielectric waveguide are generally LSE mode and LSM mode. In order for a small loss, LSM01 mode which is the lowest mode of LSM mode is usually used.

Figure 4:
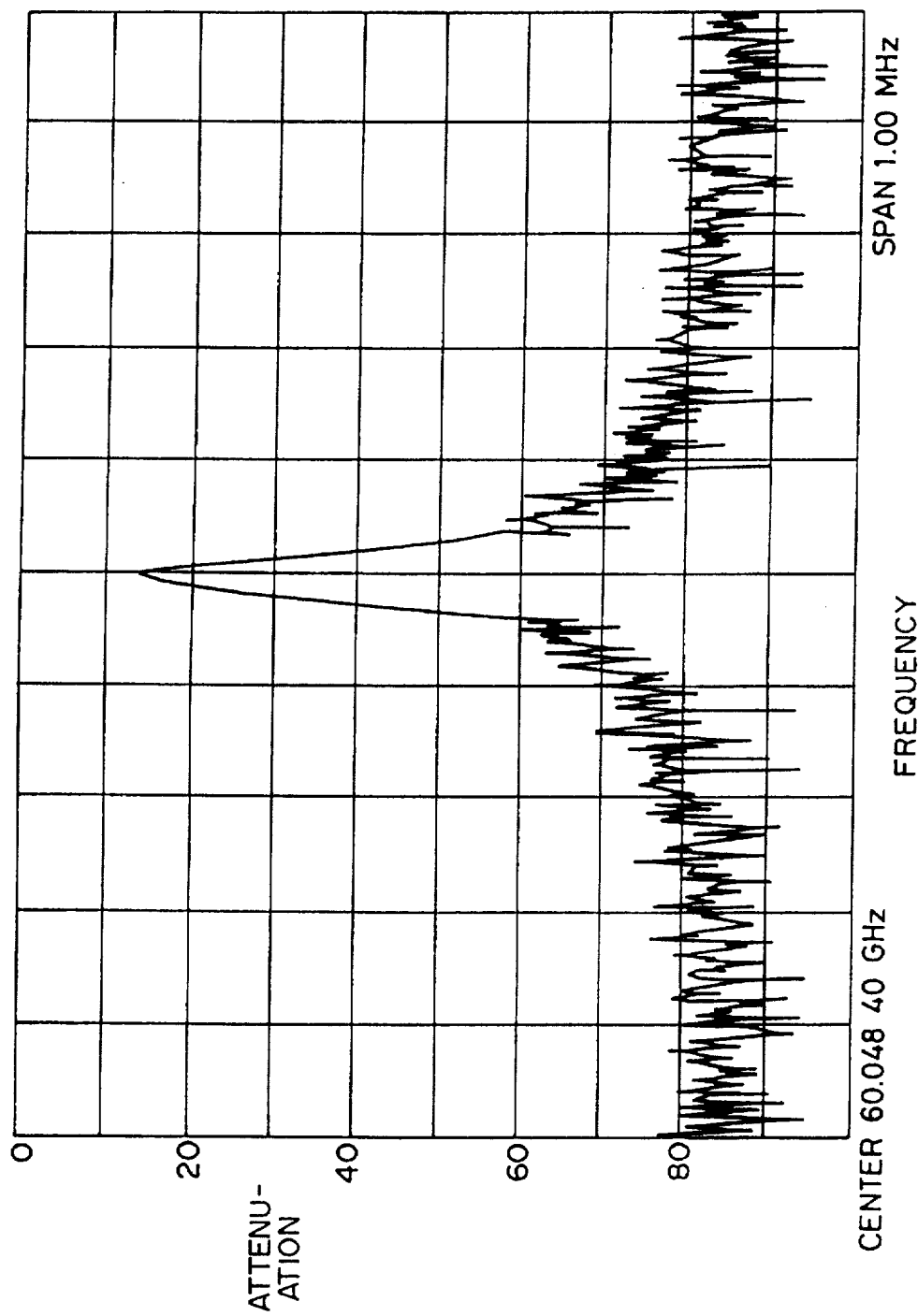
FIG. 4 is a graph which shows an oscillation characteristic of the oscillator.

The inventors evaluated the oscillator 1 by using the measuring jig 6 and a spectrum analyzer. FIG. 4 is a graph showing the oscillation characteristic of the oscillator 1. As is apparent from the graph of FIG. 4, an oscillation signal which has a resonance frequency of about 60 GHz and has a good waveform was outputted from the end 12a of the dielectric strip 12.

Figure 6A:
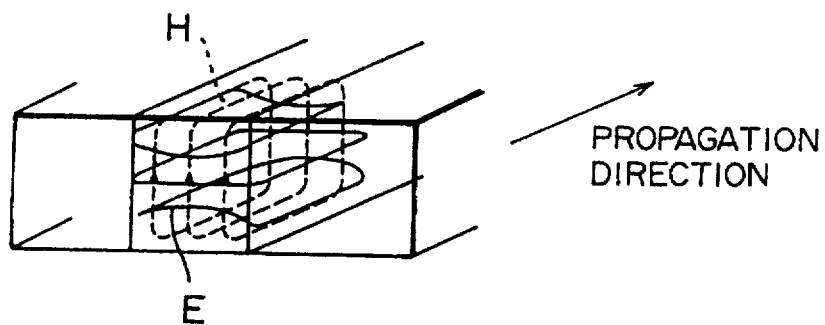
FIG. 6A is a distribution chart which shows an electric field and a magnetic field of an electromagnetic wave which is propagated in a nonradiative dielectric waveguide in LSM01 mode.
Figure 6B:
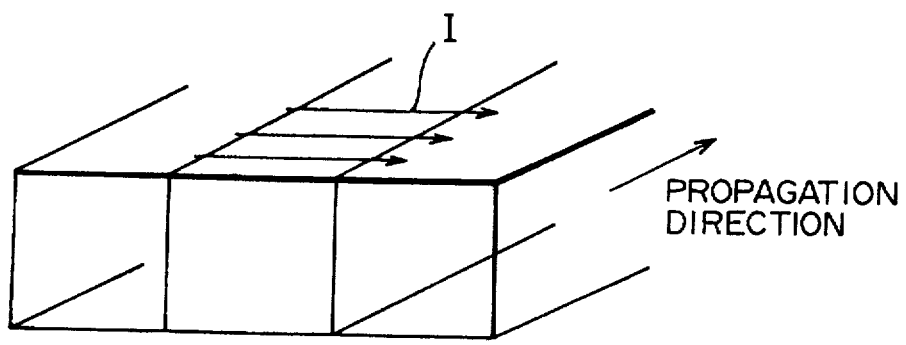
FIG. 6B is a distribution chart which shows a surface current of the electromagnetic wave which is propagated in the nonradiative dielectric waveguide in LSM01 mode.
Figure 6C:
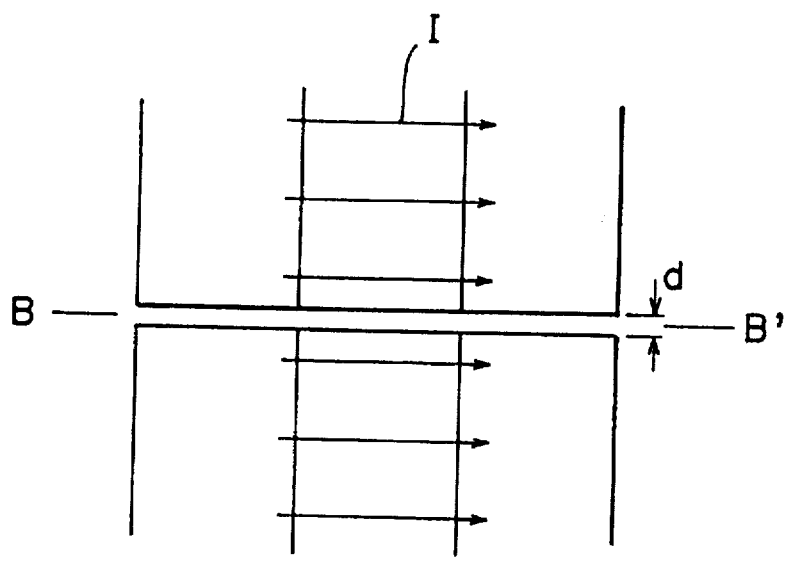
FIG. 6C is a plane distribution chart which shows the surface current of the electromagnetic wave when the nonradiative dielectric waveguide is cut off at a line B—B'.

Now, the difference between an electromagnetic wave propagated in a metal tubular waveguide and an electromagnetic wave propagated in a nonradiative dielectric waveguide is described. FIGS. 5A and 5B show an electromagnetic wave propagated in a metal tubular waveguide in TE10 mode. FIG. 5A shows the electric field E and the magnetic field H of the electromagnetic wave, and FIG. 5B shows the surface current I. FIGS. 6A, 6B and 6C show an electromagnetic wave propagated in a nonradiative dielectric waveguide in LSM01 mode. FIG. 6A shows the electric field E and the magnetic field H of the electromagnetic wave, and FIGS. 6B and 6C show the surface current I. FIG. 6C shows a state wherein the nonradiative dielectric waveguide is cut off at a line B—B'.

As is apparent from FIG. 5B, the surface current I of an electromagnetic wave propagated in a metal tubular waveguide has a component in the electromagnetic wave propagation direction. Therefore, in connecting the metal tubular waveguide to another metal tubular waveguide, the waveguides must be joined firmly without space by a flange. Otherwise, the surface current I will not flow from one of the waveguides to the other waveguide.

On the other hand, the surface current I of an electromagnetic wave propagated in a nonradiative dielectric waveguide in LSM01 mode, as is apparent from FIG. 6B, has only a component in a direction perpendicular to the electromagnetic wave propagation direction. Therefore, even if the conductive plates and the dielectric strip of the nonradiative dielectric waveguide are cut off perpendicularly to the electromagnetic wave propagation direction, that is, even if the nonradiative dielectric waveguide has a gap, the gap will not influence transmission of the electromagnetic wave.

Figure 7A:
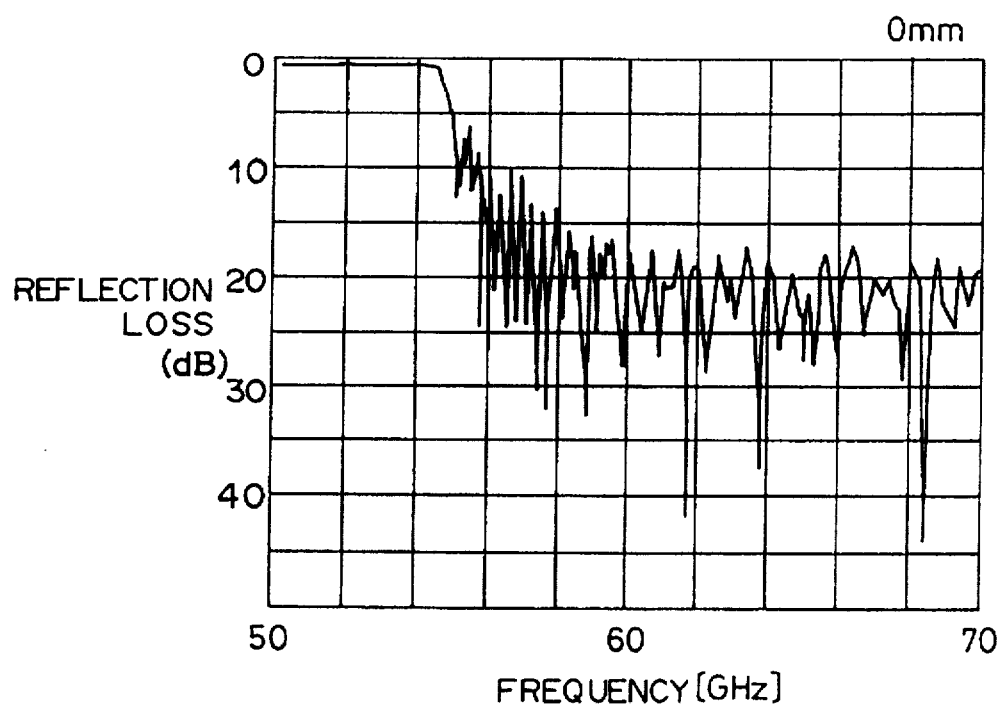
FIG. 7A is a graph which shows a reflection loss characteristic of the oscillator when the conductive plates and the dielectric strip have a gap of 0.
Figure 7B:
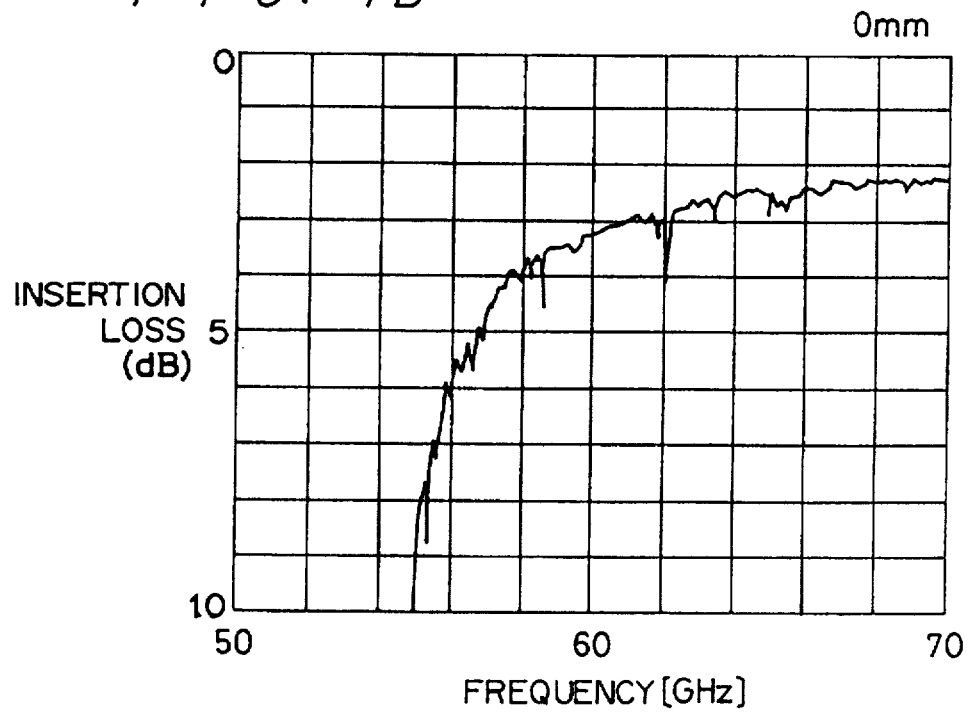
FIG. 7B is a graph which shows an insertion loss characteristic of the oscillator when the conductive plates and the dielectric strip have a gap of 0.
Figure 8A:
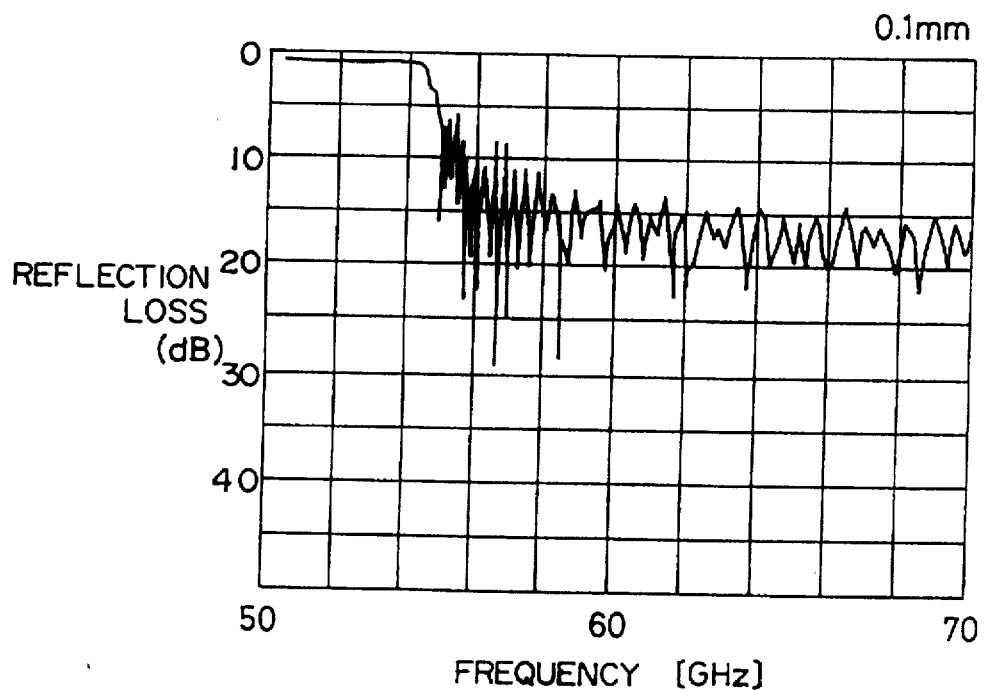
FIG. 8A is a graph which shows a reflection loss characteristic of the oscillator when the conductive plates and the dielectric strip have a gap of 0.1 mm.
Figure 8B:
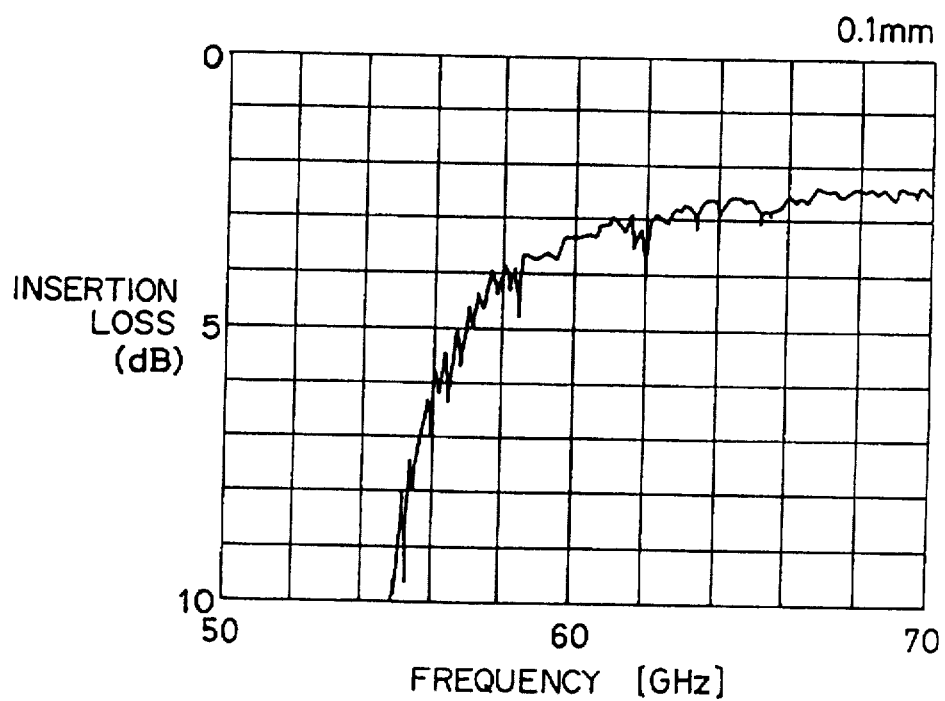
FIG. 8B is a graph which shows an insertion loss characteristic of the oscillator when the conductive plates and the dielectric strip have a gap of 0.1 mm.

In order to prove this assumption, the inventors measured the characteristics of the oscillator 1 when the conductive plates 10 and 11 and the dielectric strip 12 were cut off to have a gap d in a direction perpendicular to the electromagnetic wave propagation direction. FIGS. 7A and 7B show the characteristics when the gap d was 0. FIGS. 8A and 8B show the characteristics when the gap d was 0.1 mm. As is apparent from FIGS. 7A through 8B, the reflection loss and the insertion loss of the oscillator 1 were only a little increased when the oscillator 1 had a gap of 0.1 mm.

Now, this is applied to the connection between the dielectric strip 12 of the oscillator 1 and the dielectric strip 62 of the measuring jig 6. The case of FIGS. 7A and 7B corresponds to a case wherein the end surface 19b of the oscillator 1 and the end 12a of the dielectric strip 12 are in contact with the end surface 61a of the pressing section 610 and the end 62a of the strip 62, respectively (d=0 in FIG. 3A). The case of FIGS. 8A and 8B corresponds to a case wherein there is a gap d of 0.1 mm between the level of the end surface 19b and the end 12a and the level of the end surface 61a and the end 62a (d=0.1 mm in FIG. 3A). From the result of the experiment, it can be inferred that a slight gap between the end 12a and the end 62a is allowable. Accordingly, the connection between the oscillator 1 and the measuring jig 6 does not require firm joining by use of a flange, and pushing between the end 12a of the dielectric strip 12 and the end 62a of the dielectric strip 62 is not necessary. Therefore, only by mounting the oscillator 1 in the mount section 60 of the measuring jig 6 with the mounting surface 19b of the oscillator 1 on the base plate 601, an electromagnetic wave is propagated in the dielectric strips 12 and 62 in LSM01 mode without mismatching and with a small loss. Thus, the characteristics of the oscillator 1 can be measured accurately in a simple way.

Further, in order to estimate the characteristics in a case wherein the end 12a of the dielectric strip 12 and the end 62a of the dielectric strip 62 which are slightly protruded from the end surfaces 19b and 61a respectively are put into contact with each other, the inventors conducted an experiment in the following way. The conductive plates 10 and 11 and the dielectric strip 12 were cut off perpendicularly to the electromagnetic wave propagation direction. Then, the cut ends of the dielectric strip 12 were put into contact again, while the conductive plates 10 and 11 were rearranged to have a gap d between the respective cut ends. In this state, the characteristics of the oscillator 1 were measured.

Figure 9A:
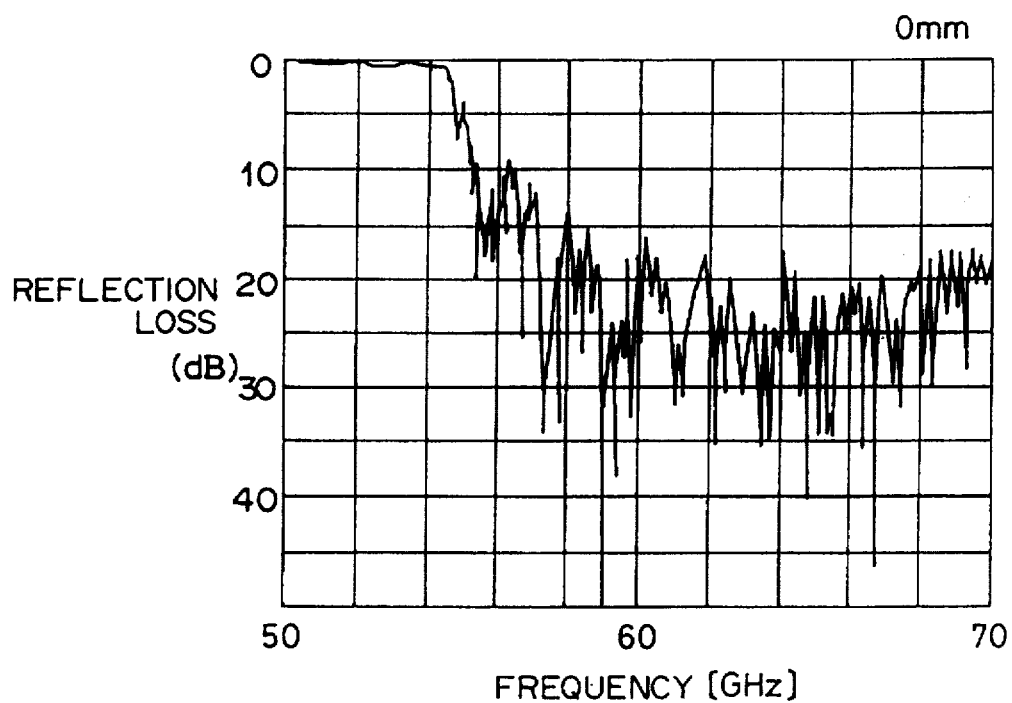
FIG. 9A is a graph which shows a reflection loss characteristic of the oscillator when the conductive plates and the dielectric strip have a gap of 0.
Figure 9B:
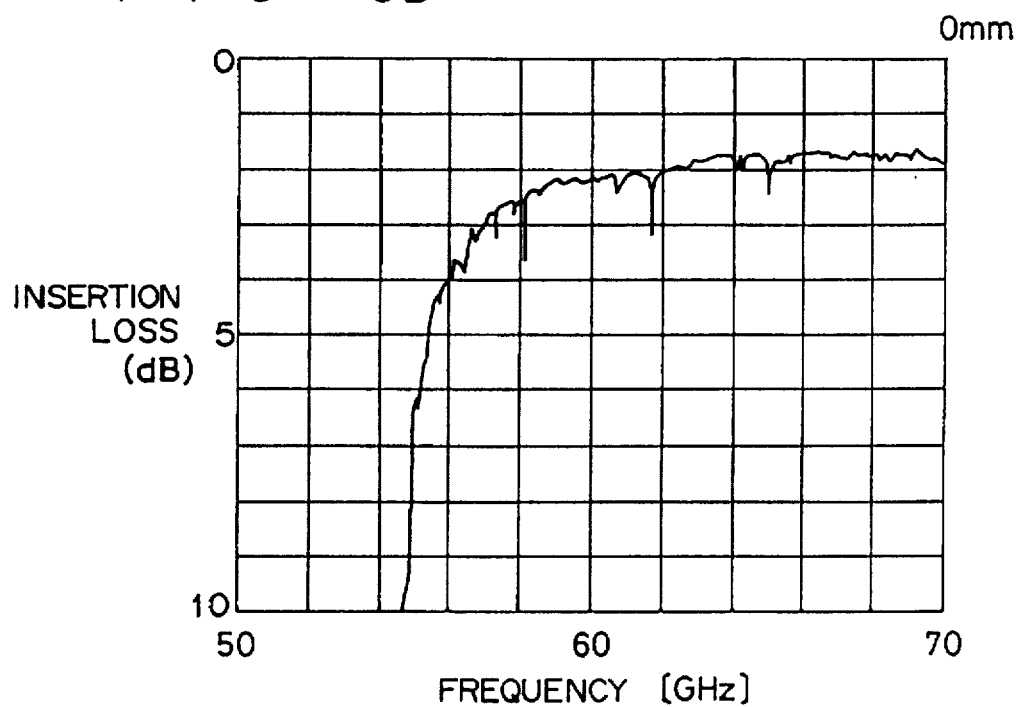
FIG. 9B is a graph which shows an insertion loss characteristic of the oscillator when the conductive plates and the dielectric strip have a gap of 0.
Figure 10A:
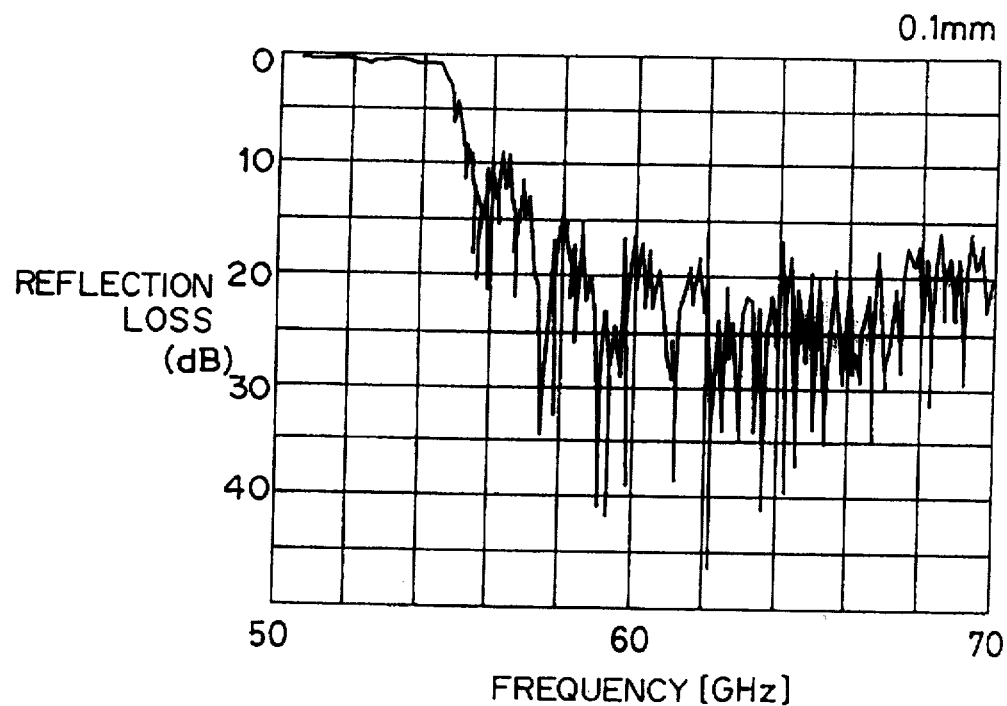
FIG. 10A is a graph which shows a reflection loss characteristic of the oscillator when only the conductive plates have a gap of 0.1 mm.
Figure 10B:
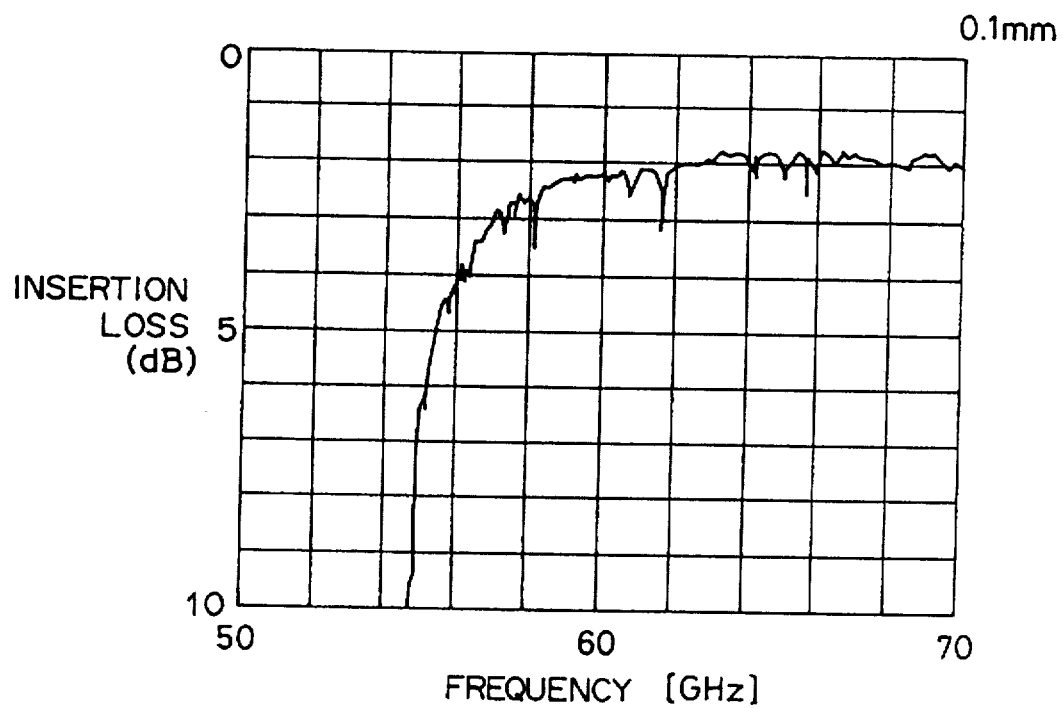
FIG. 10B is a graph which shows an insertion loss characteristic of the oscillator when only the conductive plates have a gap of 0.1 mm.

FIGS. 9A and 9B show the characteristics when the gap d was 0, and more specifically when the cut ends of the dielectric strip 12 and the cut ends of the conductive plates 10 and 11 were joined again. FIGS. 10A and 10B show the characteristics when the gap d was 0.1 mm, and more specifically when the cut ends of the dielectric strip 12 were protruded from the respective cut ends of the conductive plates 10 and 11 by 0.05 mm and were put into contact with each other. FIGS. 11A and 11B show the characteristics when the gap d was 0.2 mm, and more specifically when the cut ends of the dielectric strip 12 were protruded from the respective cut ends of the conductive plates 10 and 11 by 0.1 mm and were put into contact with each other.

As is apparent from FIGS. 9A through 11B, even if there is a gap d between the conductive plates 10 and 11, the reflection loss and the insertion loss of the oscillator 1 hardly change as long as the cut ends of the dielectric strip 12 are in contact with each other. This is applicable to the connection between the oscillator 1 and the measuring jig 6. Therefore, even if the end 12a of the strip 12 and the end 62a of the strip 62 are slightly protruded from the respective end surfaces 19b and 61a, as long as the ends 12a and 62a are in contact with each other, the reflection loss and the insertion loss will hardly change.

FIG. 12 shows the general structure of a measuring jig 6C for measuring the characteristics of the circulator 2. In FIG. 12, the same parts and members which are used for the measuring jig 6 are provided with the same reference symbols, and the description of these parts and members is omitted. Since the circulator 2 has three exposed ends 22a of the dielectric strips 22, that is, three ports, the measuring jig 6C has a structure which is a combination of three measuring jigs 6. The circulator 2 is placed In a mount section 60 of the measuring jig 6C guided by three vertical surfaces 61a. In this moment, if even one of the screws 27 comes off the circulator 2, the dielectric strips 22 may be out of position. In order to prevent this trouble, a lid 67 is put on the circulator 2, and the circulator 2 is fixed in the measuring jig 6C by screws 68. In this state, the characteristics of the circulator 2 are measured.

When a high-frequency electromagnetic wave is inputted into the circulator 2 through one of the three ports (one of the ends 22a of the strips 22), the electromagnetic wave is propagated only to a specified one of the other two ports. The inventors evaluated the circulator 2 by using the measuring jig 6C and a network analyzer. The evaluation was carried out while the circulator 2 is used as an isolator with one of the ends 22a of the dielectric strips 22 serving as a nonreflective terminal.

Figure 13A:
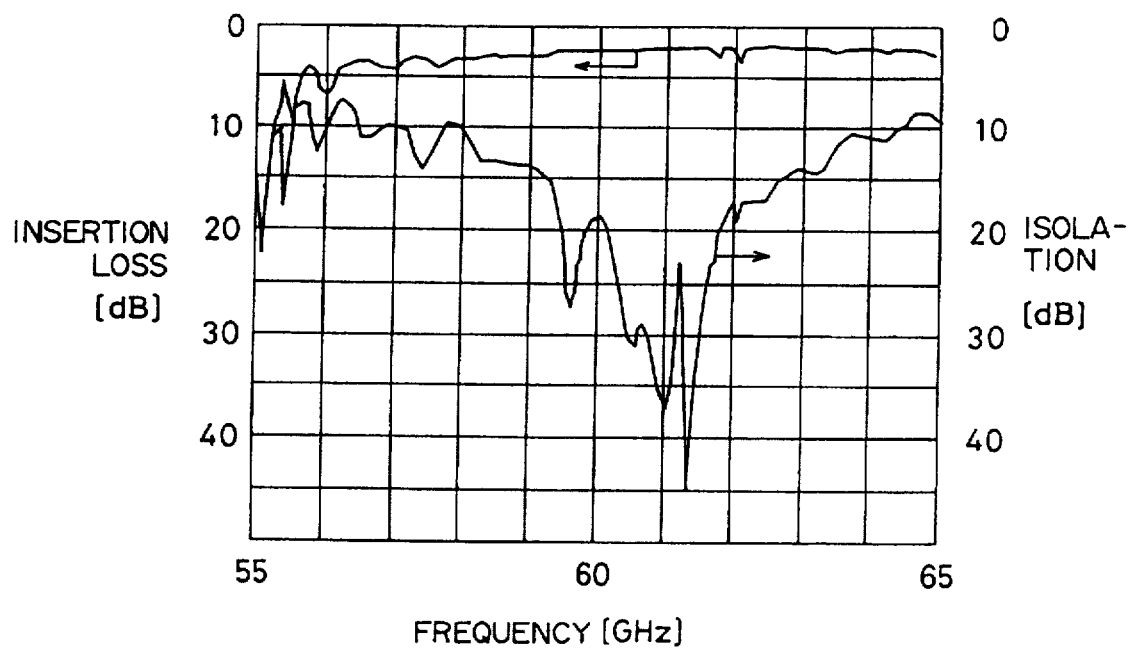
FIG. 13A is a graph which shows an insertion loss characteristic and an isolation characteristic of the circulator.
Figure 13B:
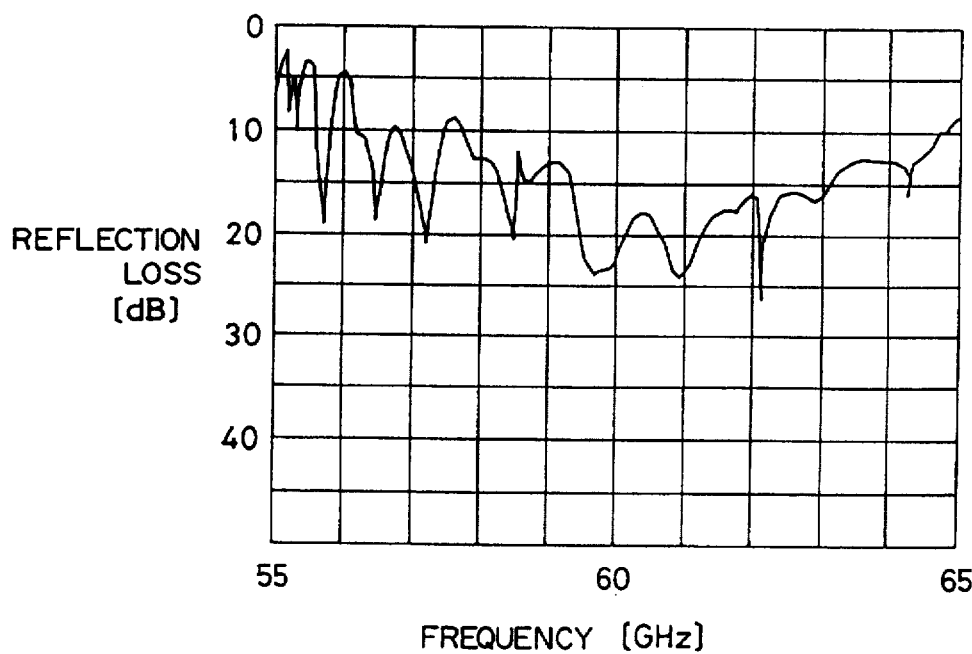
FIG. 13B is a graph which shows a reflection loss characteristic of the circulator.

FIGS. 13A and 13B show the results of the evaluation. As is apparent from FIGS. 13A and 13B, the circulator 2 has a good isolation characteristic, a good insertion loss characteristic and a good reflection loss characteristic.

In this way, the characteristics of the circulator 2 can be measured only by setting and screwing the circulator 2 in the measuring jig 6C. The connection between the circulator 2 and the measuring jig 6C does not require firm joining by use of a flange, and pushing between the ends 22a of the dielectric strips 22 and the ends 62a of the dielectric strips 62 is not necessary. When the circulator 2 is fixed in the measuring jig 6C with the mounting surface 29a of the circulator 2 on the mount section 60, an electromagnetic wave is propagated to a specified one of the dielectric strips 62 through the dielectric strips 22 in LSM01 mode without mismatching and with a small loss. Thus, by using the measuring jig 6C, the characteristics of the circulator 2 can be measured accurately in a simple way.

A measuring jig for a four-port device with a nonradiative dielectric waveguide should be structured as a combination of four measuring jigs 6. The measuring jig 6 can be used for evaluation of other one-port devices with a nonradiative dielectric waveguide as well as the oscillator 1. If the results of the evaluation of the oscillator 1, the circulator 2 and the mixer are good, these devices are surface-mounted in the respective recesses 710 of the conductive plate 71 of the mount case 7.

As shown in FIG. 1, the oscillator 1, the circulator 2 and the mixer are surface-mounted close to or in contact with the dielectric strips 72, 73, 74 and 76. Accordingly, there is no fear that the surface mounting will change the characteristics of the oscillator 1, the circulator 2 and the mixer, and these devices can perform the characteristics as measured in the evaluation by use of the measuring jigs 6 and 6C. Consequently, the produced integrated circuit is good in productivity and reliability.

Although in FIG. 1, the oscillator 1, the circulator 2 and the mixer are screwed to the conductive plate 71, it is possible to use solder or conductive paste to fix the devices on the conductive plate 71.

Figure 14:
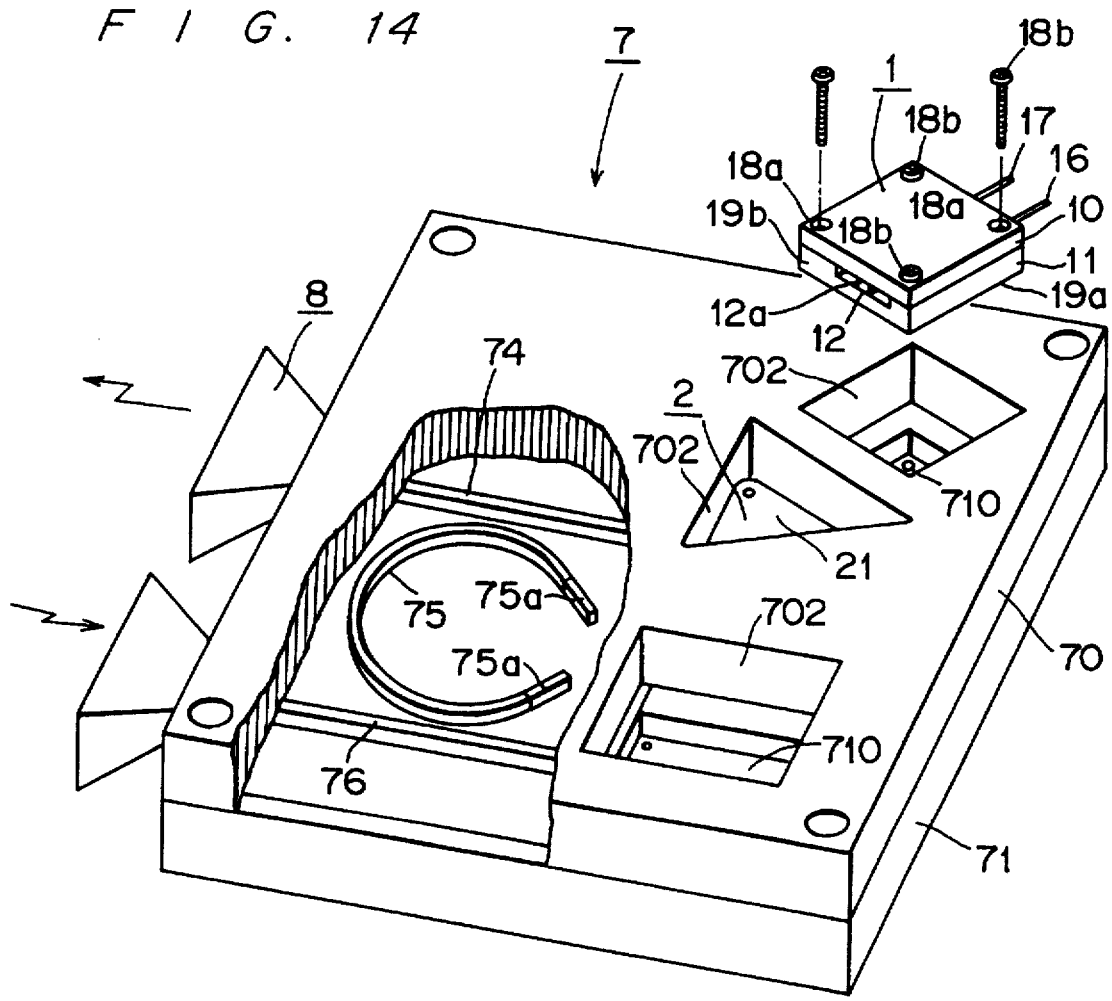
FIG. 14 is a partial perspective view of a high-frequency integrated circuit which is another embodiment of the present invention.

FIG. 14 is a perspective view of a high-frequency integrated circuit which is another embodiment of the present invention. The same parts and members which are used for the embodiment of FIG. 1 are provided with the same reference symbols, and the description thereof is omitted. The distinctive point of this embodiment is that the upper conductive plate 70 has three windows 702 through which the oscillator 1, the circulator 2 and the mixer are mounted in the mount case 7. These windows 702 are positioned right above the recesses 710 of the lower conductive plate 71.

According to this embodiment, before mounting the oscillator 1, the circulator 2 and the mixer in the mount case 7, the upper conductive plate 70 is screwed down to the lower conductive plate 71. Thereby, the dielectric strips 72, 73, 74, 75 and 76, and the nonreflective terminals 75a can be fixed between the conductive plates 70 and 71. This eliminates the process of gluing the dielectric strips 72 through 76 and the nonreflective terminals 75a to the lower conductive plate 71. Thereby, the mass productivity of the mount case 7 is improved. After screwing the upper conductive plate 70 down to the lower conductive plate 71, the oscillator 1, the circulator 2 and the mixer are mounted in the case 7 guided by the respective windows 702. Thereby, the dielectric strips of these devices can be put into contact with the dielectric strips in the mount case 7 accurately. Thus, the integrated circuit can be produced easily and is suited for mass production. Additionally, the oscillator 1, the circulator 2 and/or the mixer can be exchanged without separating the conductive plates 70 and 71, and this is convenient for maintenance.

In the above embodiments, the devices with a nonradiative dielectric waveguide are an oscillator, a circulator and a mixer. However, the present invention is applicable to a high-frequency integrated circuit which employs other devices with a nonradiative dielectric waveguide. Although the embodiments are integrated circuits which operate in a millimeter wave band, the present invention is applicable to integrated circuits which operate in a microwave band.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A high-frequency integrated circuit comprising a device and a mount case for containing said device, said circuit comprising:

a) a device with a nonradiative dielectric waveguide comprising:

a pair of first conductors which are parallel to each other with a specified spacing; a first dielectric strip which is disposed between the first conductors; a plane mounting surface which is formed on one of the first conductors; and an end surface which is formed on an end of the first conductors so as to be vertical to a direction in which an electromagnetic wave is propagated in the first dielectric strip, an end of the first dielectric strip being exposed on the end surface; and b) a mount case with a nonradiative dielectric waveguide in which said device with a nonradiative dielectric waveguide is mounted, the mount case comprising:

a pair of second conductors which are parallel to each other with a specified spacing, said device with a nonradiative dielectric waveguide being mounted between the second conductors; and a second dielectric strip which is disposed between the second conductors, an end of said second dielectric strip being electromagnetically coupled to said end of said first dielectric strip.

2. A high-frequency integrated circuit as claimed in claim 1, wherein the exposed end of the first dielectric strip is close to an end of the second dielectric strip.

3. A high-frequency integrated circuit as claimed in claim 1, wherein the exposed end of the first dielectric strip is in contact with an end of the second dielectric strip.

4. A high-frequency integrated circuit as claimed in claim 1, wherein the exposed end of the first dielectric strip has a projection which is protruded from the end surface of the first conductors.

5. A high-frequency integrated circuit as claimed in claim 1, wherein the exposed end of the first dielectric strip has a recess which is retracted from the end surface of the first conductors.

6. A high-frequency integrated circuit as claimed in claim 1, wherein the device with a nonradiative dielectric waveguide is an oscillator.

7. A high-frequency integrated circuit as claimed in claim 1, wherein the device with a nonradiative dielectric waveguide is a circulator.

8. A high-frequency integrated circuit as claimed in claim 1, wherein one of the second conductors has a window through which the device with a nonradiative dielectric waveguide is mounted in the mount case.

9. A high-frequency integrated circuit as claimed in claim 1, further comprising an antenna provided to the mount case.

* * * * *